United States Patent
Joseph et al.

(10) Patent No.: US 9,105,583 B2
(45) Date of Patent: Aug. 11, 2015

(54) CATALYTIC ETCH WITH MAGNETIC DIRECTION CONTROL

(71) Applicant: International Business Machines Corporation, Armonk, NY (US)

(72) Inventors: Eric A. Joseph, White Plains, NY (US); David W. Abraham, Croton, NY (US); Roger W. Cheek, Somers, NY (US); Alejandro G. Schrott, New York, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 13/735,314

(22) Filed: Jan. 7, 2013

(65) Prior Publication Data

US 2014/0191371 A1   Jul. 10, 2014

(51) Int. Cl.
*H01L 21/31*   (2006.01)
*H01L 21/308*   (2006.01)
*H01L 21/306*   (2006.01)
(Continued)

(52) U.S. Cl.
CPC ........ *H01L 21/3081* (2013.01); *H01L 21/3065* (2013.01); *H01L 21/30604* (2013.01); *H01L 21/32134* (2013.01); *H01L 21/32137* (2013.01); *H01L 29/0657* (2013.01); *H01L 29/16* (2013.01)

(58) Field of Classification Search
CPC ............... H01L 21/3086; H01L 21/31116; H01L 21/31144; H01L 21/0332
USPC ................... 438/735, 745; 257/618
See application file for complete search history.

(56) References Cited

U.S. PATENT DOCUMENTS

| 4,668,338 A | 5/1987 | Maydan et al. |
| 6,410,448 B1 | 6/2002 | DeOrnellas et al. |

(Continued)

FOREIGN PATENT DOCUMENTS

| JP | 6316779 A | 11/1994 |
| JP | 7-94475 A | 4/1995 |

OTHER PUBLICATIONS

Gottscho, R.A. et al., "Microscopic Uniformity in Plasma Etching" Journal of Vacuum Science & Technology B (Sep. 1992) pp. 2133-2147, vol. 10, No. 5.
Tsujino, K. et al., "Helical Nanoholes Bored in Silicon by Wet Chemical Etching Using Platinum Nanoparticles as Catalyst" Electrochemical and Solid-State Letters (Oct. 2005) pp. C193-C195, vol. 8, No. 12.

(Continued)

*Primary Examiner* — Monica D Harrison
(74) *Attorney, Agent, or Firm* — Scully, Scott, Murphy & Presser, P.C.; H. Daniel Schnurmann

(57) ABSTRACT

A material can be locally etched with arbitrary changes in the direction of the etch. A ferromagnetic-material-including catalytic particle is employed to etch the material. A wet etch chemical or a plasma condition can be employed in conjunction with the ferromagnetic-material-including catalytic particle to etch a material through a catalytic reaction between the catalytic particle and the material. During a catalytic etch process, a magnetic field is applied to the ferromagnetic-material-including catalytic particle to direct the movement of the particle to any direction, which is chosen so as to form a contiguous cavity having at least two cavity portions having different directions. The direction of the magnetic field can be controlled so as to form the contiguous cavity in a preplanned pattern, and each segment of the contiguous cavity can extend along an arbitrary direction.

13 Claims, 6 Drawing Sheets

(51) Int. Cl.
  *H01L 21/3065* (2006.01)
  *H01L 21/3213* (2006.01)
  *H01L 29/06* (2006.01)
  *H01L 29/16* (2006.01)

(56) References Cited

U.S. PATENT DOCUMENTS 6,624,084 B2 * 9/2003 Maeda et al. ................ 438/732
7,033,514 B2   4/2006 Rueger
7,374,636 B2   5/2008 Horioka et al.

2012/0034707 A1 * 2/2012 Datta et al. .................... 436/501

OTHER PUBLICATIONS

Fang, H. et al., "Silver Catalysis in the Fabrication of Silicon Nanowire Arrays" Nanotechnology (Jul. 2006) pp. 3768-3774, vol. 17, No. 15.

Veeramachaneni et al., "Magnetic Particle Motion in a Gradient Field" Proceedings of the COMSOL Conference (Mar. 14, 2007).

Tsujino, K. et al., "Boring Deep Cylindrical Nanoholes in Silicon Using Silver Nanoparticles as a Catalyst" Advanced Materials (Apr. 2005) pp. 1045-1047, vol. 17, No. 8.

* cited by examiner

CATALYTIC ETCH WITH MAGNETIC DIRECTION CONTROL

BACKGROUND

The present disclosure relates to a method for a catalytic etch with magnetic direction control, an apparatus for performing the same, and a structure formed by the same.

Various anisotropic etch methods are known in the art. Such methods include an anisotropic reactive ion etch that provides directional removal of a material employing a patterned mask layer. The direction of the etch remains the same throughout the anisotropic etch process.

Crystallographic wet etches can also provide anisotropic removal of a material through formation of crystallographic facets during the etch. The direction of the etch is normal to the crystallographic surfaces during the etch.

Methods known in the art do not enable an arbitrary change in the etch direction. Thus, the variety of structures that can be patterned by local removal of a material is limited.

SUMMARY

A material can be locally etched with arbitrary changes in the direction of the etch. A ferromagnetic-material-including catalytic particle is employed to etch the material. A wet etch chemical or a plasma condition can be employed in conjunction with the ferromagnetic-material-including catalytic particle to etch the material through a catalytic reaction between the catalytic particle and the material. During a catalytic etch process, a non-uniform magnetic field is applied to the ferromagnetic-material-including catalytic particle to direct the movement of the particle to any direction, which in one embodiment may be chosen so as to form a contiguous cavity having at least two cavity portions having different directions. The direction of the spatial variation of the magnetic field can be controlled so as to form the contiguous cavity in a pre-planned pattern, and each segment of the contiguous cavity can extend along an arbitrary direction.

According to an aspect of the present disclosure, a method of etching a material is provided. At least one ferromagnetic-material-including catalytic particle is disposed on a material. A catalytic etch process is performed on the material by activating the at least one ferromagnetic-material-including catalytic particle with a chemical or a plasma. A direction of propagation of the at least one ferromagnetic-material-including catalytic particle is changed during the catalytic etch process by changing a direction of the spatial variation of the magnetic field applied to the at least one ferromagnetic-material-including catalytic particle.

According to another aspect of the present disclosure, a system for etching a material is provided. The system includes an apparatus that contains an etch chamber and a magnetic field generating apparatus. The etch chamber is configured to perform a catalytic etch process of a material by activating at least one ferromagnetic-material-including catalytic particle. The magnetic field generating apparatus is configured to apply a magnetic field to the at least one ferromagnetic-material-including catalytic particle within the etch chamber along at least two independent directions.

According to yet another aspect of the present disclosure, a patterned structure is provided, which includes a substrate having a surface, and a plurality of contiguous cavities extending from the surface. Each of the plurality of contiguous cavities has a substantially same geometrical shape that including at least a first cavity portion extending along a first direction and a second cavity portion extending along a second direction. The first direction and the second direction are different.

DETAILED DESCRIPTION

Figure 1:
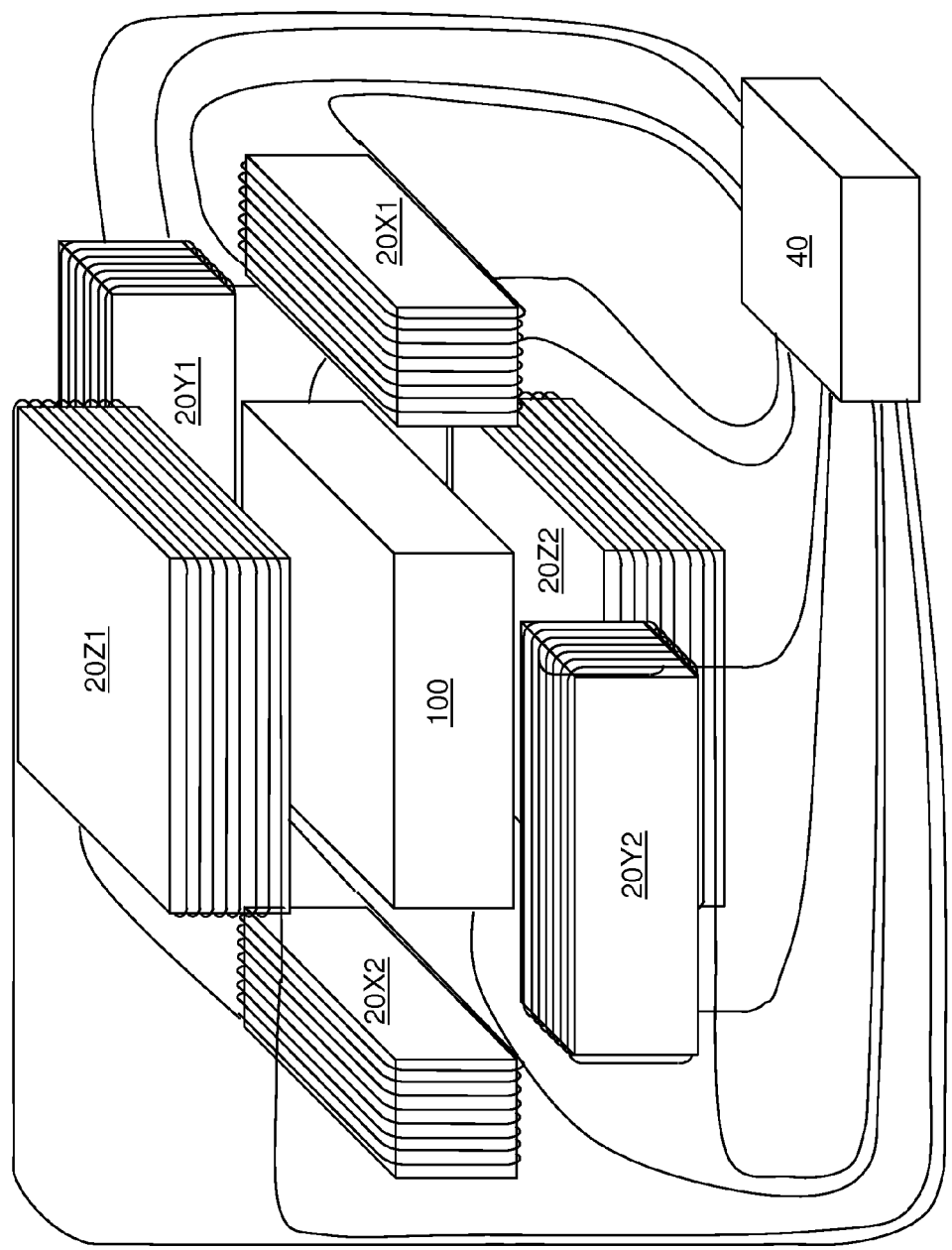
FIG. 1 is a schematic view of a first exemplary system for catalytically etching a material according to an embodiment of the present disclosure.

As stated above, the present disclosure relates to a method for a catalytic etch with magnetic direction control, an apparatus for performing the same, and a structure formed by the same. Aspects of the present disclosure are described herein with accompanying figures. Throughout the drawings, the same reference numerals or letters are used to designate like or equivalent elements. The drawings are not necessarily drawn to scale.

Figure 2:
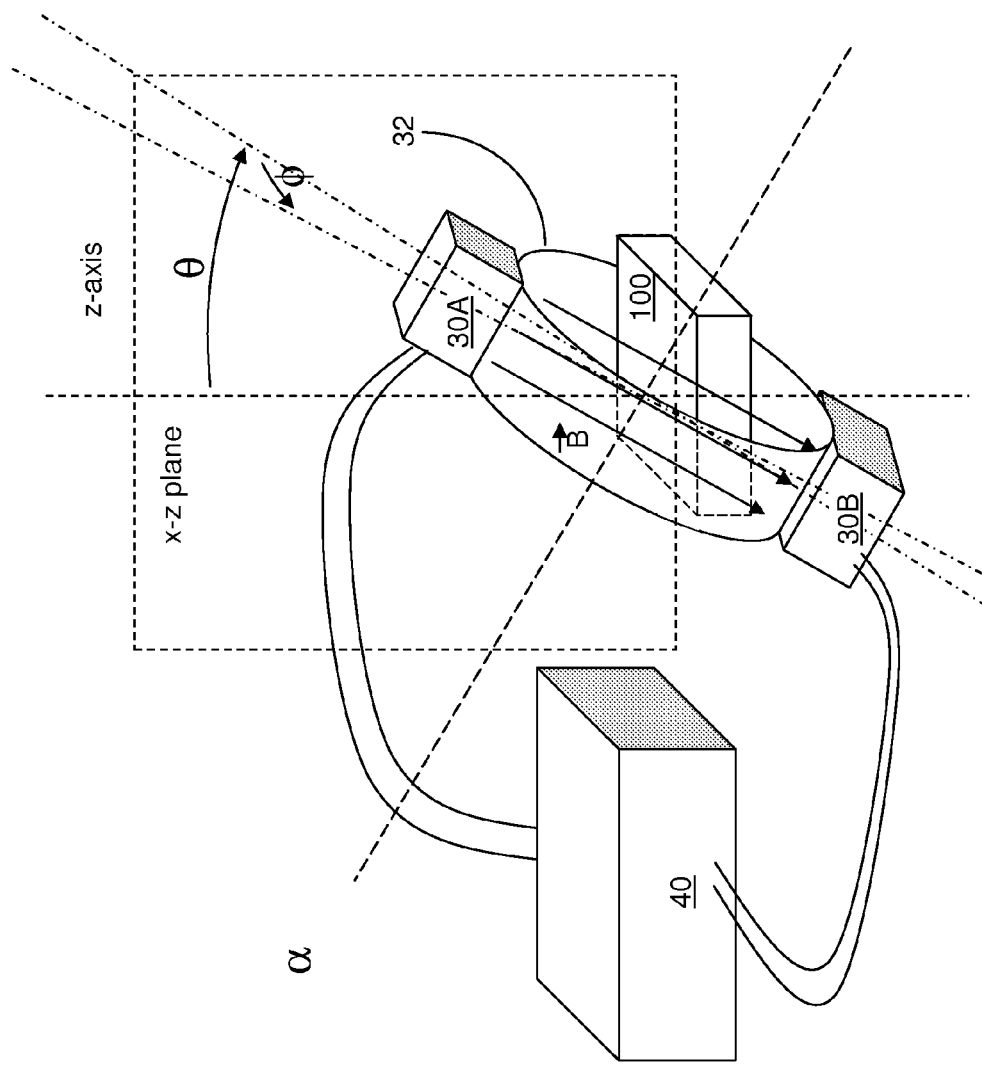
FIG. 2 is a schematic view of a second exemplary system for catalytically etching a material according to an embodiment of the present disclosure.

Referring to FIGS. 1 and 2, a first exemplary system for catalytically etching a material and a second exemplary system for catalytically etching a material are respectively shown. As used herein, a "catalytic etch" refers to an etch process that proceeds through a catalyst. In a catalytic etch process, a material is etched where a catalyst is present, and remains substantially unetched where a catalyst is not present. As used herein, "catalytically etching" refers to the act of performing a catalytic etch.

Each of the first and second exemplary systems includes an apparatus for performing a catalytic etch. Each of the first and second exemplary systems includes an etch chamber 100 configured to perform a catalytic etch process of a material. The catalytic etch can be performed by activating at least one ferromagnetic-material-including catalytic particle.

In one embodiment, each of the at least one ferromagnetic-material-including catalytic particle includes a combination of a ferromagnetic material core and a surface coating over the ferromagnetic material core such that the surface coating includes a catalytic material that functions as a catalyst for the catalytic etch process. In another embodiment, the at least one ferromagnetic-material-including catalytic particle can consist of a ferromagnetic material that is a catalytic material that functions as a catalyst for the catalytic etch process.

In one embodiment, the etched material can be a semiconductor material. The semiconductor material can include at least one elemental semiconductor material. The semiconductor material can be, for example, silicon, a silicon-germanium alloy, a silicon-carbon alloy, a silicon-germanium-carbon alloy, or germanium. The semiconductor material can be an intrinsic semiconductor material or a doped semiconductor material including at least one p-type dopant and/or at least one n-type dopant. The semiconductor material can be a single crystalline semiconductor material, a polycrystalline semiconductor material, an amorphous semiconductor material, or a stack or a combination thereof.

In one embodiment, the etch chamber can be configured to accommodate a semiconductor substrate having a uniform thickness and having a lateral dimension of at least 10 mm. In one embodiment, the semiconductor substrate can be a circular-shape substrate having a diameter in a range from 25 mm to 450 mm and a thickness in a range from 50 micron to 2 mm, although lesser and greater diameters and/or lesser and greater thicknesses can also be employed.

In one embodiment, the catalytic etch process can be a wet etch process employing a wet etch solution. In this case, a catalytic surface of the at least one ferromagnetic-material-including catalytic particle can be activated by the wet etch solution to etch a semiconductor material.

In another embodiment, the catalytic etch process can be a plasma etch process employing a plasma. In this case, the catalytic surface of the at least one ferromagnetic-material-including catalytic particle can be activated by the plasma to etch a semiconductor material.

The coating of the catalytic surface can include any catalytic material that provides a catalytic etch of a semiconductor material in combination with a suitable wet etch solution or under a suitable plasma condition. In one embodiment, the catalytic surface can be activated in a wet etch solution, and the catalytic surface of the at least one ferromagnetic-material-including catalytic particle can be, for example, a silver surface, a platinum surface, or a surface of any other metal that can provide a catalytic etching of a semiconductor material in combination with a suitable etchant. The wet etch solution can be, for example, a mixture of hydrofluoric acid and hydrogen peroxide. Silver particles that catalytically etch a semiconductor material in the presence of a mixture of hydrofluoric acid and hydrogen peroxide are described, for example, in Tsujino K et al., *Boring Deep Cylindrical Nanoholes in Silicon Using Silver Nanoparticles as a Catalyst*, Advanced Materials, Vol. 17, Issue 8, pp. 1045-1047 (2005). Platinum particles that catalytically etch a semiconductor material in the presence of a mixture of hydrofluoric acid and hydrogen peroxide are described, for example, in Tshjino et al., *Helical Nanoholes Bored in Silicon by Wet Chemical Etching Using Platinum Nanoparticles as Catalyst*, Electrochem. Solid-State Lett., Vol. 8, issue 12, pp. C193-C195 (2005).

In another embodiment, the catalytic surface can be activated under a plasma condition, and the catalytic surface of the at least one ferromagnetic-material-including catalytic particle can be, for example, a tungsten surface, a silver surface, or a surface of any other metal that can provide a catalytic etching of a semiconductor material under a suitable plasma condition.

Figure 3B:
FIG. 3B is a tunneling electron micrograph (TEM) of a silicon material etched with the same catalytic plasma etch process employed to etch the silicon surface shown in FIG. 3A.
Figure 3A:
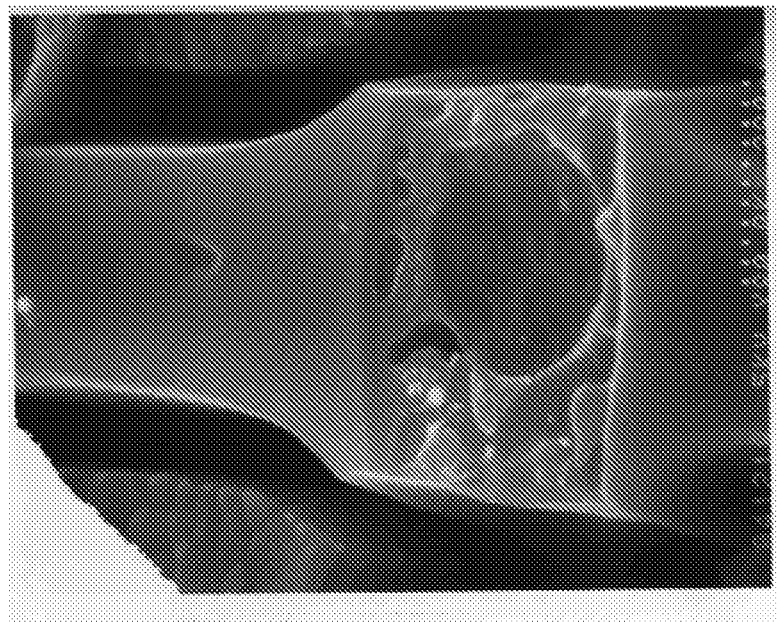
FIG. 3A is a scanning electron micrograph (SEM) of a silicon surface etched with a catalytic plasma etch process.

Referring to FIG. 3A, a silicon surface is shown from which a catalytic etching of silicon proceeded downward employing tungsten particles as a catalyst that was activated under a plasma of $SF_6$ gas. FIG. 3B is a transmission electron micrograph of a portion of the silicon material underneath the silicon surface shown in FIG. 3A. Various portions of cavities formed by a catalytic etching of silicon are shown. Tungsten particles functioned as catalysts in the presence of an $SF_6$ plasma in this case. Portions of cavities that are shown in FIG. 3B and not contiguously connected to the top surface (shown at the upper left portion of the TEM picture) are contiguously connected to the top surface through extensions of the same cavities that are not shown. The extensions of the cavities were present outside the thickness range of the sample from which the TEM picture was generated, and thus, were removed during preparation of the TEM sample.

Figure 4B:
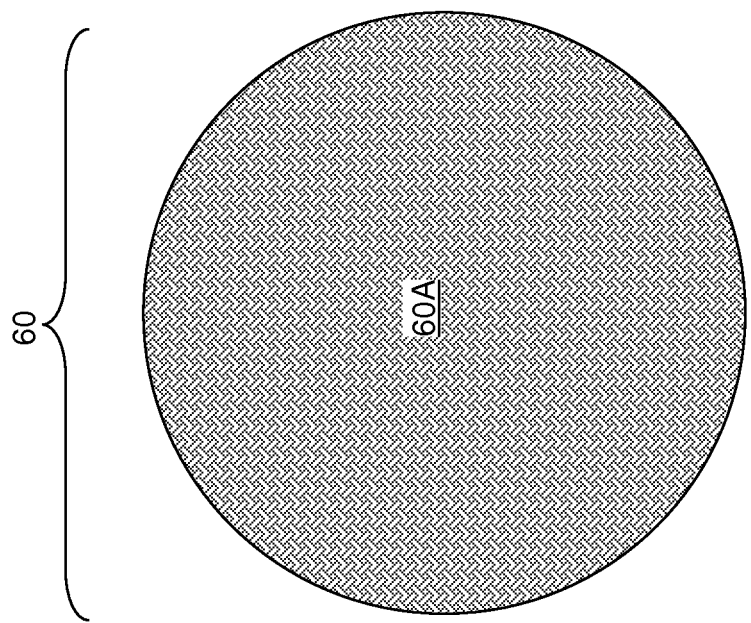
FIG. 4B is a cross-sectional view of a second exemplary ferromagnetic-material-including catalytic particle according to an embodiment of the present disclosure.
Figure 4A:
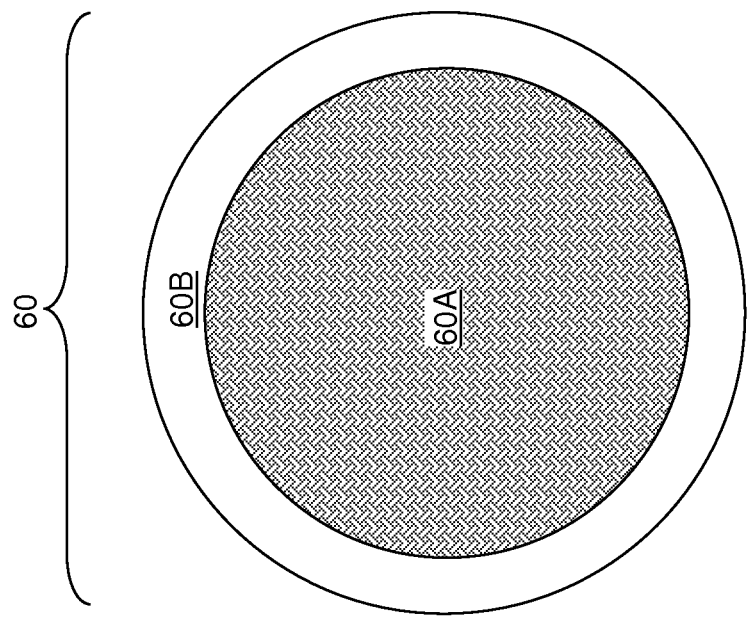
FIG. 4A is a cross-sectional view of a first exemplary ferromagnetic-material-including catalytic particle according to an embodiment of the present disclosure.

Referring to FIG. 4A, if the material on the surface of the at least one ferromagnetic-material-including catalytic particle 60 is not intrinsically ferromagnetic, the catalytic surface can be formed on a ferromagnetic core 50A by coating the catalytic material employing any coating method known in the art. The catalytic material on the surface of the ferromagnetic core 60A is herein referred to as a catalytic surface coating 60B.

For example, the ferromagnetic core 60A can include an elemental ferromagnetic material such as iron, cobalt, nickel, dysprosium, gadolinium, and neodymium, and/or a compound ferromagnetic material such as chromium oxide, ferrites, gallium manganese arsenide, magnetite, a permalloy, a rare-earth magnet made of a rare-earth alloy material, a samarium-cobalt alloy, suessite, and yttrium iron garnet, or combinations or alloys thereof. The ferromagnetic core can have a characteristic lateral dimension in a range from 3 micron to 300 microns, although lesser and greater characteristic lateral dimensions can also be employed. As used herein, a characteristic lateral dimension is a diameter of a sphere having a same volume as the ferromagnetic core. Thus, for a ferromagnetic core having a volume of V, the characteristic lateral dimension D is given by:

$$V = \frac{4\pi}{3}(D/2)^3, \text{ i.e., } D = \sqrt[3]{\frac{6V}{\pi}}.$$

The thickness of the coating that forms the catalytic surface coating 60B can be, for example, from 5 nm to 100 microns, although lesser and greater coating thicknesses can also be employed.

Referring to FIG. 4B, if the material on the surface of the at least one ferromagnetic-material-including catalytic particle 60 is intrinsically ferromagnetic, each of the at least one ferromagnetic-material-including catalytic particle 60 can consist of the catalytic material that is also ferromagnetic. In this case, each of the at least one ferromagnetic-material-including catalytic particle 60 consists of a ferromagnetic core 60A, of which the surface is a catalytic surface that is activated in a suitable wet etch solution or under a suitable plasma condition. Any of the ferromagnetic materials described above can be employed for the material of the ferromagnetic core 60A provided that the surfaces of the material of the ferromagnetic core 60A can be activated as a catalytic surface in a suitable wet etch solution or under a suitable plasma condition.

Referring back to FIGS. 1 and 2, each of the first and second exemplary systems includes a magnetic field generating apparatus configured to apply a non-uniform magnetic field to the at least one ferromagnetic-material-including catalytic particle 60 within the etch chamber 100. The magnetic field generating apparatus is configured to enable application of variations of the non-uniform magnetic field along at least two independent directions, i.e., two directions with a finite angle therebetween.

In one embodiment, the magnetic field generating apparatus can be configured to change the magnetic field along at least three directions that are not within a same two-dimensional plane. For example, the magnetic field generating apparatus can be configured to change the magnetic field along three axes of a Cartesian coordinate system.

For example, the magnetic field generating apparatus in the first exemplary system illustrated in FIG. 1 includes a first x-axis electromagnet 20X1, a second x-axis electromagnet 21X2, a first y-axis electromagnet 20Y1, a second y-axis electromagnet 20Y2, a first z-axis electromagnet 20Z1, and a second z-axis electromagnet 20Z2. The first x-axis electromagnet 20X1 and the second x-axis electromagnet 20X2 can be operated in conjunction to generate a magnetic field along a +x direction or a −x direction (i.e., the direction from the center of the second x-axis electromagnet 20X2 to the center of the first x-axis electromagnet 20X1 or the direction from the center of the first x-axis electromagnet 20X1 to the center of the second x-axis electromagnet 20X2, respectively). The first y-axis electromagnet 20Y1 and the second y-axis electromagnet 20Y2 can be operated in conjunction to generate a magnetic field along a +y direction or a −y direction (i.e., the direction from the center of the second y-axis electromagnet 20Y2 to the center of the first y-axis electromagnet 20Y1 or the direction from the center of the first y-axis electromagnet 20Y1 to the center of the second y-axis electromagnet 20Y2, respectively). The first z-axis electromagnet 20Z1 and the second z-axis electromagnet 20Z2 can be operated in conjunction to generate a magnetic field along a +z direction or a −z direction (i.e., the direction from the center of the second z-axis electromagnet 20Z2 to the center of the first z-axis electromagnet 20Z1 or the direction from the center of the first z-axis electromagnet 20Z1 to the center of the second z-axis electromagnet 20Z2, respectively). Magnetic fields from multiple electromagnets can be superposed to generate a magnetic field along an arbitrary direction and with an arbitrary magnitude along the said arbitrary direction (up to the maximum magnetic field intensity that the capabilities of the various electromagnets allow). The magnitude and orientation of the magnetic field within the etch chamber 100 can be controlled as a function of time in an arbitrary manner by a power supply and control unit 40, which is configured to control the various electromagnets.

In another illustrative example, the magnetic field generating apparatus in the first exemplary system illustrated in FIG. 2 includes an annular support structure 32. The annular support structure 32 can be ring-shaped, and can have an axial direction α that is perpendicular to the plane that bisects the annular support structure 32 into two identical ring-shaped portions. The annular support structure 32 can be tiltable and rotatable such that the tilt angle θ of the axial direction α with respect to a z-axis of a Cartesian coordinate system can vary in a range from 0 degree to 90 degrees, and the rotation angle φ of the axial direction α with respect to a x-axis of a Cartesian coordinate system can vary in a range from 0 degree to 180 degrees.

A first electromagnet 30A and a second electromagnetic 30B can be mounted to the annular support structure 32 such that the first electromagnet 30A and the second electromagnetic 30B are located at opposite sides of the annular support structure 32. Further, the first electromagnet 30A and the second electromagnetic 30B can be slidable along the surfaces of the annular support structure 32, i.e., around the axial direction α of the annular support structure 32, by an angle in a range from 0 to 360 degrees. The first electromagnet 30A and the second electromagnet 30B can be powered by a power supply and control unit 40. In one embodiment, the first electromagnet 30A and the second electromagnet 30B can generate a uniform or non-uniform magnetic field along the direction from the center of the first electromagnet 30A to the center of the second magnet 30B (or vice versa) with an arbitrary magnitude (up to the maximum magnetic field intensity that the capabilities of the combination of the first and second electromagnets (30A, 30B) allows).

Each of the magnetic field generating apparatuses of FIG. 1 and FIG. 2 is configured to contiguously change a direction of the magnetic field and its intensity along the said direction during operation of the catalytic etch process. Further, each of the magnetic field generating apparatuses of FIG. 1 and FIG. 2 is configured to align the magnetic field along an arbitrary spatial orientation within a three-dimensional polar coordinate system. Likewise, each of the magnetic field generating apparatuses of FIG. 1 and FIG. 2 is configured to align the magnetic field along an arbitrary spatial orientation within a three-dimensional Cartesian coordinate system.

The size of the ferromagnetic core 60A and the size of each ferromagnetic-material-including catalytic particle 60 can be selected such that the magnetic force is the average dominant force that affects the movement of the ferromagnetic-material-including catalytic particle 60 during the catalytic etch.

The magnetic force applied to a ferromagnetic-particle of magnetic moment M-including catalytic particle 60 is given by:

$$F_{mag} = (M \cdot \nabla) B$$

where B is the modulus (intensity)) of the magnetic flux density (in Tesla). $F_{mag}$ can be greater than the sum of all other miscellaneous pinning or dragging forces.

Figure 5:
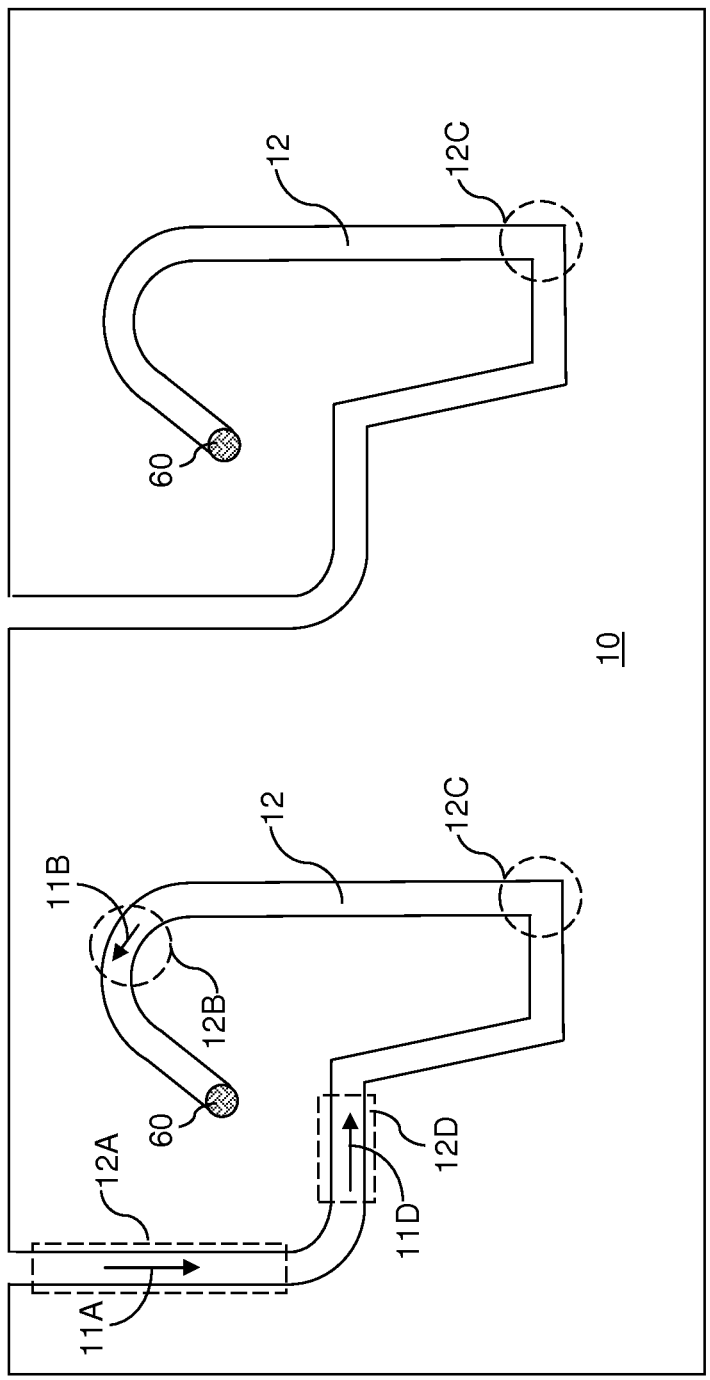
FIG. 5 is a first exemplary patterned structure according to an embodiment of the present disclosure.

A system including an etch chamber 100 and a magnetic field generating apparatus, such as the first and second exemplary systems, can be employed to etch a material with contiguous cavities having an arbitrary shape. Referring to FIG. 5, at least one ferromagnetic-material-including catalytic particle 60 can be disposed on a top surface of a semiconductor substrate 10 including a semiconductor material. The at least one ferromagnetic-material-including catalytic particle 60 can be disposed on the top surface of the semiconductor substrate 10 prior to loading the semiconductor substrate 10 into an etch chamber 100 (See FIGS. 1 and 2), or the at least one ferromagnetic-material-including catalytic particle 60 can be dispensed from within an etch chamber onto the top surface of the semiconductor substrate 10 after the semiconductor substrate 10 is loaded into an etch chamber 100

Subsequently, a catalytic etch process is performed on the semiconductor material of the semiconductor substrate 10 by activating the at least one ferromagnetic-material-including catalytic particle 10 with a chemical or a plasma as described above. During the catalytic etch process, the direction of propagation of the at least one ferromagnetic-material-including catalytic particle 60 is changed by changing the direction or magnitude of the magnetic field applied to the at least one ferromagnetic-material-including catalytic particle 60.

In one embodiment, the direction of propagation of the at least one ferromagnetic-material-including catalytic particle 60 can be controlled such that at least one contiguous cavity 12 including at least a first cavity portion 12A extending along a first direction 11A and a second cavity portion 12B extending along a second direction 11B. The first direction 11A and the second direction 11B are different. Each cavity portion can be a straight portion including a single direction of propagation, or can be a curved portion including a continuously changing direction of propagation. The direction of extension of a curved cavity portion can be defined at any point within the curved cavity portion as the tangential direction along which the curved cavity extends, i.e., the direction obtained by determining a limit of a direction along which a continuously shrinking cylinder that approximates a continuously shrinking segment of the curved cavity that includes the point at which the tangential direction is evaluated.

Each of the at least one contiguous cavity 12 can include a section in which a propagation direction of the contiguous cavity 12 changes continuously. For example, the second cavity portion 12B is a section in which the propagation direction of the contiguous cavity 12 changes continuously.

Each of the at least one contiguous cavity 12 can include a third cavity portion 12C extending along a third direction. The third direction can be along a direction that is not within the plane including the first direction 11A and the second direction 11B. In one embodiment, the third direction can be perpendicular to the first direction 11A and the second direction 11B. For example, the third direction can be perpendicular to the plane shown in FIG. 5 (i.e., extend into or out of the plane of FIG. 5. In one embodiment, the first direction, the second direction, and the third direction are not within a same two-dimensional plane.

The at least one contiguous cavity 12 can be a plurality of contiguous cavities 12. The plurality of cavities 12 can have generally identical cavity features. As used herein, "cavity features" refer to the overall shape, the length of each segment, and the curvature of each segment. As used herein, cavity features of a first cavity and a second cavity are "generally identical" if a topologically homeomorphic transformation exists between the first cavity and the second cavity such that for each segment in the first cavity, there exists a corresponding segment in the second cavity and vice versa, and for each length of a segment in a first cavity, the corresponding length in the second cavity is between 0.5 times the length of the segment in the first cavity and 2.0 times the length of the segment in the first cavity, and for each finite radius of curvature in a segment of a first cavity, the corresponding radius of curvature in the second cavity is between 0.5 times the radius of cavity of the segment in the first cavity and 2.0 times the radius of cavity of the segment in the first cavity. It is understood that the topologically homeomorphic transformation is performed after smoothing the physical surfaces of the plurality of cavities 12 to eliminate surface roughness that is present in any physical structure. As used herein, topologically homeomorphic transformation has the same meaning as used in mathematics, i.e., a transformation by a continuous function between topological spaces that has a continuous inverse function.

In one embodiment, for each length of a segment in a first cavity, the corresponding length in the second cavity is between 0.75 times the length of the segment in the first cavity and 1.5 times the length of the segment in the first cavity, and for each finite radius of curvature in a segment of a first cavity, the corresponding radius of curvature in the second cavity is between 0.75 times the radius of cavity of the segment in the first cavity and 1.5 times the radius of cavity of the segment in the first cavity.

In one embodiment, for each length of a segment in a first cavity, the corresponding length in the second cavity is between 9/10 times the length of the segment in the first cavity and 10/9 times the length of the segment in the first cavity, and for each finite radius of curvature in a segment of a first cavity, the corresponding radius of curvature in the second cavity is between 9/10 times the radius of cavity of the segment in the first cavity and 10/9 times the radius of cavity of the segment in the first cavity.

In one embodiment, for each length of a segment in a first cavity, the corresponding length in the second cavity can be substantially identical to the length of the segment in the first cavity, and for each finite radius of curvature in a segment of a first cavity, the corresponding radius of curvature in the second cavity can be substantially identical to the radius of cavity of the segment in the first cavity. As used herein, two quantities derived from cavities are substantially identical if the differences between the two quantities can be attributed to surface roughness of the cavities.

It is noted that the spatial orientations of the corresponding features across the plurality of contiguous trenches 12 are the same.

A patterned semiconductor structure can be formed by employing the methods of the present disclosure described above. The first exemplary patterned semiconductor structure shown in FIG. 5 can include, for example, a semiconductor substrate 10 having a surface (e.g., the planar top surface of the semiconductor substrate as illustrated in FIG. 5), and a plurality of contiguous cavities 12 extending from the surface. Each of the plurality of contiguous cavities 12 has a substantially same geometrical shape that including at least a first cavity portion 12A extending along a first direction 11A and a second cavity portion 12B extending along a second direction 11B. The first direction 11A and the second direction 11B are different. Each of the plurality of contiguous cavities 12 can include a section in which a propagation direction of the each contiguous cavity changes continuously (such as the second cavity portion 12B).

Further, each of the plurality of contiguous cavities 12 can include a third cavity portion 12C extending along a third direction such that the first direction 11A, the second direction 11B, and the third direction are not within a same two-dimensional plane.

In one embodiment, the angle between the first direction 11A and the second direction 11B can be at least 90 degrees.

Figure 6:
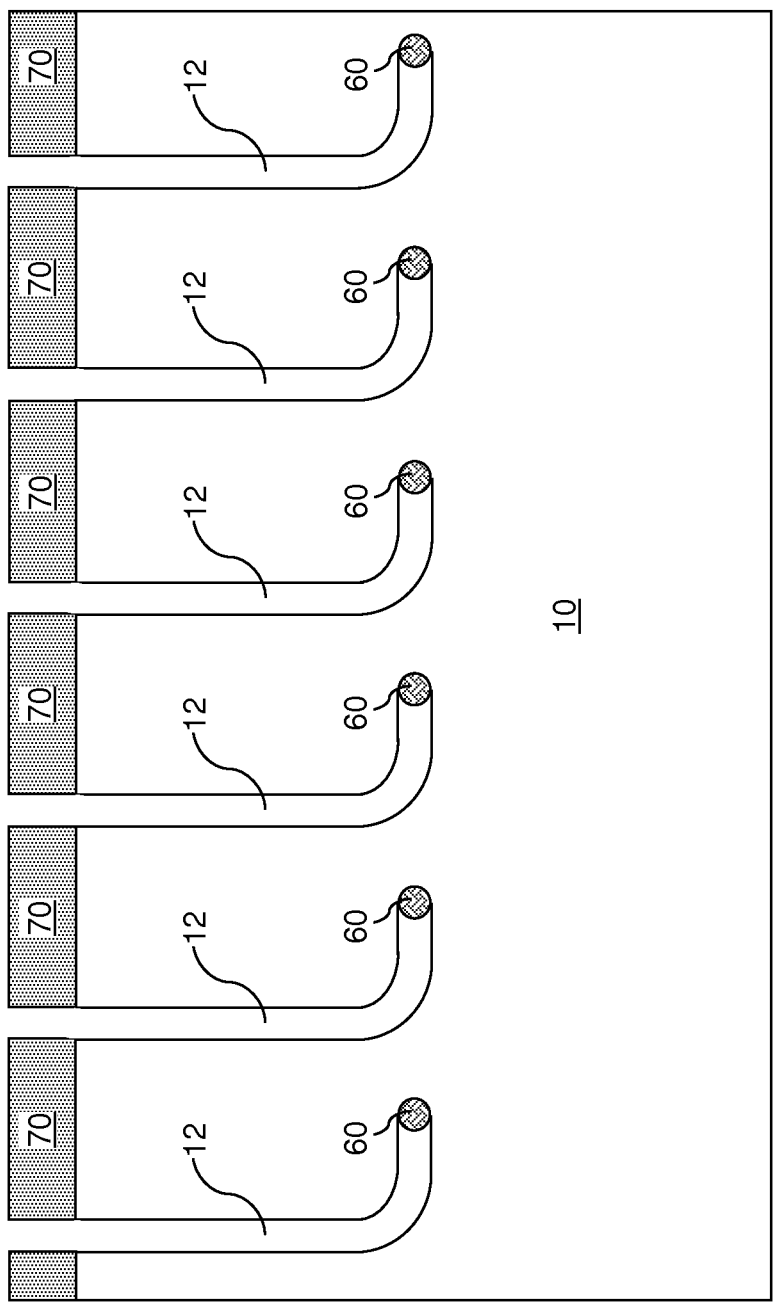
FIG. 6 is a second exemplary patterned structure according to an embodiment of the present disclosure.

Referring to FIG. 6, a second exemplary patterned semiconductor structure formed by the methods of the present disclosure is shown. A material layer 70 is present over the semiconductor substrate 10. The material layer 70 includes a plurality of holes therein so that ferromagnetic-material-including catalytic particle 60 can pass through the material layer 70 only at locations in which the holes are present. The material layer 70 can include a non-semiconductor material that is resistant to the catalytic etch process. The non-semiconductor material can include an insulator material such as silicon oxide, silicon nitride, a dielectric metal oxide material, a dielectric metal nitride material, or combinations thereof. Alternately or additionally, the non-semiconductor material can include a metallic material provided that the metallic material does not interact with the semiconductor material of the semiconductor substrate 10. For example, the non-semiconductor material can include a conductive metal nitride or a conductive metal carbide. The material layer 70 can cover the top surface of the semiconductor substrate 10. The diameter of the openings in the material layer 70 can be selected to match the diameter of equivalent lateral dimensions of the ferromagnetic-material-including catalytic particle 60.

One end of each of the plurality of contiguous cavities 12 coincides with one of the plurality of holes in the material layer 70. A ferromagnetic-material-including catalytic particle 60 propagates through the semiconductor substrate 10 to form the plurality of contiguous cavities 12, which can have generally identical cavity features among one another.

In one embodiment, ferromagnetic-material-including catalytic particles 60 of the same size can be employed, and the sizes of the holes in the material layer 70 can be selected such that only one ferromagnetic-material-including catalytic particle 60 can pass through each hole. In this case, each of the plurality of contiguous cavities 60 can have substantially identical (i.e., identical when surface roughness is not considered). A ferromagnetic-material-including catalytic particle 60 proceeds at the tip of each of the plurality of contiguous trenches 12 during the catalytic etch process, and is embedded within an end of each of the plurality of contiguous cavities 12 during the catalytic etch. The ferromagnetic-material-including catalytic particles 60 may remain within the semiconductor substrate 10 at the end of the catalytic etch process, or may exit the semiconductor substrate through the top surface, bottom surface, or a sidewall surface of the semiconductor substrate 10. Optionally, the material layer 70 may be removed to facilitate the removal of the ferromagnetic-material-including catalytic particles 60 through the top surface of the semiconductor substrate 10.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of etching a material, said method comprising:
    disposing at least one ferromagnetic-material-including catalytic particle on a material;
    performing a catalytic etch process on said material by activating said at least one ferromagnetic-material-including catalytic particle with a chemical or a plasma; and
    changing a direction of propagation of said at least one ferromagnetic-material-including catalytic particle during said catalytic etch process by changing a direction of a gradient of a magnetic field applied to said at least one ferromagnetic-material-including catalytic particle, wherein said magnetic field is generated by a first x-axis magnet and a second x-axis magnet on opposing sides of said material in the x-direction, a first y-axis magnet and a second y-axis magnet on opposing sides of said material in the y-direction, and a first z-axis magnet and a second z-axis magnet on opposing sides of said material in the z-direction.

2. The method of claim 1, wherein said direction of propagation of said at least one ferromagnetic-material-including catalytic particle is controlled to form a contiguous cavity including at least a first cavity portion extending along a first direction and a second cavity portion extending along a second direction, wherein said first direction and said second direction are different.

3. The method of claim 2, wherein said contiguous cavity includes a section in which a propagation direction of said contiguous cavity changes continuously.

4. The method of claim 2, wherein said contiguous cavity includes a third cavity portion extending along a third direction, wherein said first direction, said second direction, and said third direction are not within a same two-dimensional plane.

5. The method of claim 1, wherein said at least one ferromagnetic-material-including catalytic particle comprises:
    a ferromagnetic material core; and
    a surface coating over said ferromagnetic material core, said surface coating comprising a catalytic material that functions as a catalyst for said catalytic etch process.

6. The method of claim 1, wherein said at least one ferromagnetic-material-including catalytic particle consists of a ferromagnetic material that is a catalytic material that functions as a catalyst for said catalytic etch process.

7. The method of claim 1, wherein said catalytic etch process is a wet etch process employing a wet etch solution, wherein a surface of said at least one ferromagnetic-material-including catalytic particle is activated by said wet etch solution to etch said material.

8. The method of claim 1, wherein said catalytic etch process is a plasma etch process employing a plasma, wherein a surface of said at least one ferromagnetic-material-including catalytic particle is activated by said plasma to etch said material.

9. A system for catalytically etching a material, said system comprising an apparatus containing:
    an etch chamber configured to perform a catalytic etch process of a material by activating at least one ferromagnetic-material-including catalytic particle; and
    a magnetic field generating apparatus comprising a first x-axis magnet and a second x-axis magnet and on opposing sides of said etch chamber in the x-direction, a first y-axis magnet and a second y-axis magnet on opposing sides of said etch chamber in the y-direction, and a first z-axis magnet and a second z-axis magnet on opposing sides of said etch chamber in the z-direction, wherein said magnets are configured to apply a non-uniform magnetic field to said at least one ferromagnetic-material-including catalytic particle within said etch chamber along at least three directions that are not within a same two-dimensional plane.

10. The system of claim 9, wherein said magnetic field generating apparatus is configured to contiguously change a direction of said magnetic field during operation of said catalytic etch process.

11. The system of claim 9, wherein said magnetic field generating apparatus is configured to align said magnetic field along an arbitrary spatial orientation within a three-dimensional polar coordinate system.

12. The system of claim 9, wherein said catalytic etch process is a wet etch process employing a wet etch solution, wherein a surface of said at least one ferromagnetic-material-including catalytic particle is activated by said wet etch solution to etch said material.

13. The system of claim 9, wherein said catalytic etch process is a plasma etch process employing a plasma, wherein a surface of said at least one ferromagnetic-material-including catalytic particle is activated by said plasma to etch said material.

* * * * *